United States Patent [19]

Gigoux

[11] 3,913,223

[45] Oct. 21, 1975

[54] METHOD OF MANUFACTURING A DOUBLE-SIDED CIRCUIT

[75] Inventor: Claude Gigoux, Paris, France

[73] Assignee: Thomson-CSF, Paris, France

[22] Filed: Oct. 24, 1973

[21] Appl. No.: 409,295

[30] Foreign Application Priority Data

Oct. 27, 1972 France ............................ 72.38200

[52] U.S. Cl. .................. 29/625; 96/36.2; 174/68.5; 204/15; 317/101 B

[51] Int. Cl.[2] ........................ H05K 3/06; H05K 3/28

[58] Field of Search ............. 29/624, 625; 174/68.5; 204/15, 20, 29, 30, 32 R, 32 S, 38 B, 38 S, 38 E, 46; 117/212, 213, 215, 217, 218, 66, 67; 96/36.2, 38, 38.4; 156/3, 7, 8, 11

[56] References Cited

UNITED STATES PATENTS

| | | | |
|---|---|---|---|
| 3,566,461 | 3/1971 | Carbonel | 204/15 X |
| 3,583,066 | 6/1971 | Carbonel | 29/625 X |
| 3,611,558 | 10/1971 | Carbonel | 29/625 X |
| 3,673,680 | 7/1972 | Tanaka et al. | 204/15 X |
| 3,681,134 | 8/1972 | Nathanson et al. | 117/212 |
| 3,700,443 | 10/1972 | Reimann | 117/212 X |
| 3,812,019 | 5/1974 | Needham et al. | 29/625 X |

*Primary Examiner*—Lowell A. Larson
*Assistant Examiner*—Joseph A. Walkowski
*Attorney, Agent, or Firm*—Cushman, Darby & Cushman

[57] ABSTRACT

A method for manufacturing a double-sided circuit designed to form a multilayers circuit structure comprises successively deposition of conductor layer and conductor stud having contact surface upon a temporary substrate which is eliminated by etching with a chemical agent and replaced by a dielectric material which recovers the double sided-circuit except on a level with said contact surfaces.

5 Claims, 14 Drawing Figures

METHOD OF MANUFACTURING A DOUBLE-SIDED CIRCUIT

The present invention relates to a method of manufacturing a double-sided circuit designed to form a multilayers circuit structure.

Conventional circuits of this kind are expensive and have many drawbacks for example the complete circuit has to be scrapped if one of the conductive layers is defective and it is impossible to include active or passive elements in the internal layers, and this involves a loss of space.

Methods using a stack of wafers are known and overcome these drawbacks. Each wafer, is for example, a double-sided circuit with two conductor patterns, active devices and conductor studs that contact other double-sided circuit placed immediately above and below. The stack is held together by a mechanical clamping system and thus can be dismantled at any time for maintenance.

The present invention is concerned with a method of manufacturing double-sided circuits comprising metal studs capable of application to the conductors designed to receive them, said method being characterised in that it involves nothing other than techniques of photoetching and electrolysis, and excludes all mechanical processes such as drilling hole for example.

According to the present invention, there is provided a method of manufacturing a double-sided circuit designed to form a multilayers circuit structure comprising studs and contact surfaces such that after stacking of said double-sided circuits, the studs are in contact with said surface, said method comprises successively deposit upon a temporary substrate soluble by chemical agent, through successive appropriate masks of photoresists, of said stud and patterns of conductors wiring, progressive elimination of said temporary substrate, replacing the eliminated substrate by dielectric material; recovering both face of device so obtained by a layer of said dielectric material; engraving said layer of dielectric material through a mask so that said contact surfaces are bared.

For a better understanding of the invention and to show how the same may be carried into effect, reference will be made to the drawing appended to ensuing description and in which.

Figure 1:
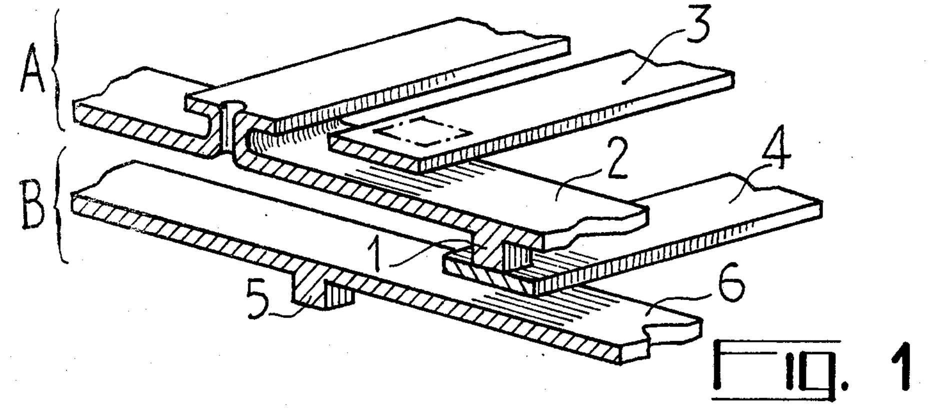
FIGS. 1 and 2 illustrate an example of two double-sided circuits.

FIG. 1 illustrates an assembly of two double-sided circuits connected by means of a connecting stud 1. To simplify the Figure, the active or passive elements have not been shown because, in fact, their implantation into the circuits does not fall within the scope of the present invention. A first circuit A comprises a first conductor 2, a second conductor 3. The conductor 2 carries the stud 1 designed to effect the connection with the conductor 4 of the second circuit B which likewise comprises a conductor 6 with a stud 5 designed for contacting with a conductor of a third double-sided circuit which has not been shown. Thus, the invention can be extended to a multilayers circuit comprising *n* double-sided circuits each equipped with at least one contact stud designed to bear against the conductor of the adjacent circuit. Each of these circuits is embedded in a resin, with the exclusion of the studs and their supporting points.

Figure 2:
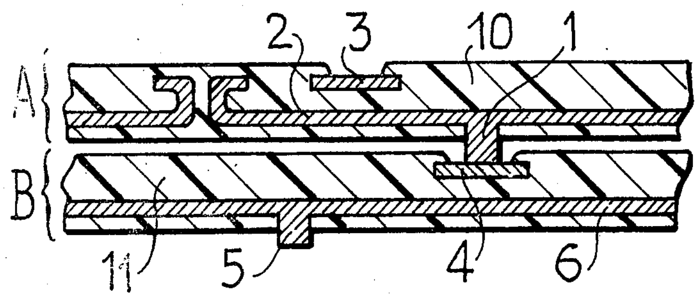

FIG. 2 is a sectional view of FIG. 1. The same elements carry the same references in all the figures. The conductors 2 and 3 of the circuit A are embedded in the resin 10 with the exception of the stud 1 which is exposed in order to be able to be applied to the conductor 4 of the circuit B.

One of the chief features of the method of manufacturing such circuits, resides in the fact that it makes it possible, by means of conventional photoetching techniques, electrolysis and chemical etching, to produce at least one conductor, equipped with a stud, said conductor being embedded in the resin, with the exclusion of said stud, and at least one conductor embedded in said resin with the exclusion of a surface designed to mate with one of the studs of the adjacent circuit.

FIGS. 3 to 13 schematically illustrate the steps of manufacture of a circuit produced in accordance with the invention.

Figure 3:
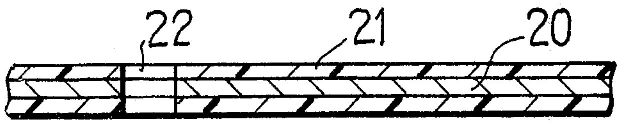
FIGS. 3 to 13 illustrate the main steps of the manufacture of these circuits, according to the invention.

The first step consists in taking a copper substrate 20 on both faces of which there is deposited a photosensitive resin 21, as FIG. 3 shows. By photographic and etching techniques, a hole 22 is pierced through the copper 20.

Figure 4:
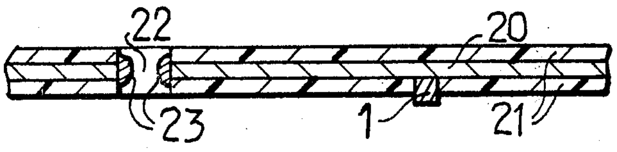

During the course of the second step shown in FIG. 4, the photosensitive resin 21 is exposed and removed at precisely the location of the stud 1 which, for example, can be manufactured in gold by electrolysis. The gold deposits wherever the copper is bared, that is to say where the resin has been exposed and removed, but also at the hole 22 in the form of the deposit 23 which is the start of the conductor 2.

Figure 5:
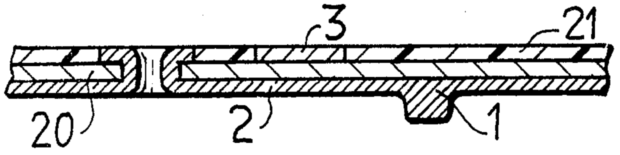

The fourth step is shown in FIG. 5. The photoresist is removed on a level with the conductors 2 and 3. Electrolysis enables a gold deposit to be produced, forming said conductors 2 and 3, on the bared zones of the copper.

Figure 6:
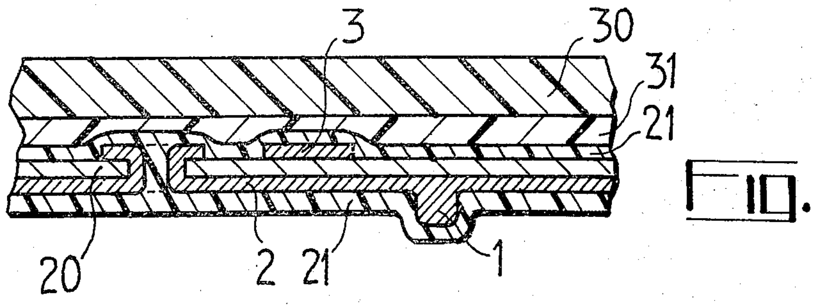
Figure 7:
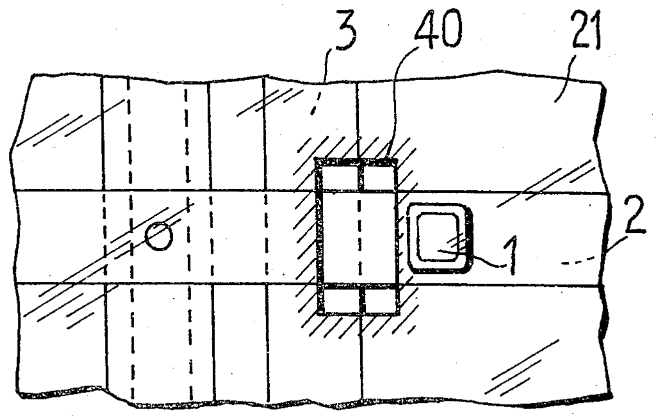
Figure 8:
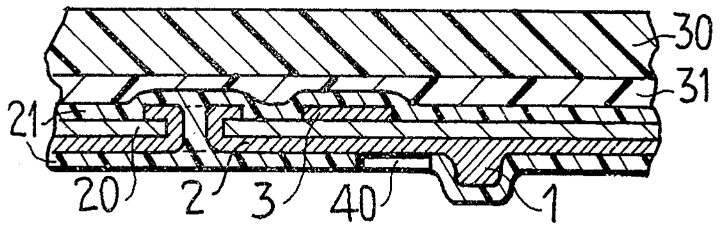

Subsequently, the fifth step, shown in FIGS. 6, 7, 8 and 9, makes it possible to hollow out a recess beneath the conductor 3 over a width substantially equal to half the width of said conductor. To do this, on both faces of the device shown in Fig. 5, a fresh film of resin 21 of positive type, is deposited and then on the face opposite the stud 1 there is applied a dry photosensitive resin 31 of negative type, covered with polyethylene terephthalate 30 better known by the name of "mylar". (FIG. 6). Using a suitable mask, the window 40 shown in FIG. 7, the latter being a plan view of FIG. 8, is exposed. Subsequently, by a known method of selective etching of the copper 20, the latter being referred to as the metal (a) to distinguish it from the metal (b) constituting the conductors and the studs, the copper 20 located beneath the conductor 2 is etched away to form a recess 50, in the manner shown in FIG. 9 which latter is a sectional view illustrating the condition at the end of the sixth step. The etching conditions are chosen so that the copper 20 is etched away over half the width, approximately, of the conductor 3.

This constitutes the first phase of destruction of the copper substrate 20, whose function is to act as a temporary support for the construction of the circuit and which, at the end of the operation, is replaced by a thermosetting resin.

Figure 10:
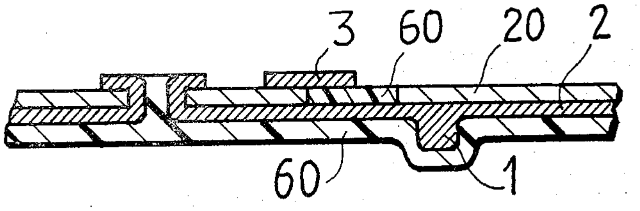

FIG. 10 illustrates the seventh step. The circuit is enveloped is a polyimide resin 60 on the face opposite to the mylar, the resin 60 being located in particular in the gaps left by the removal of the copper. After partial polymerisation of the polyimide resin, the mylar 30 and the dry resin film 31 are removed, and polymerisation then completed (FIG. 10).

Figure 9:
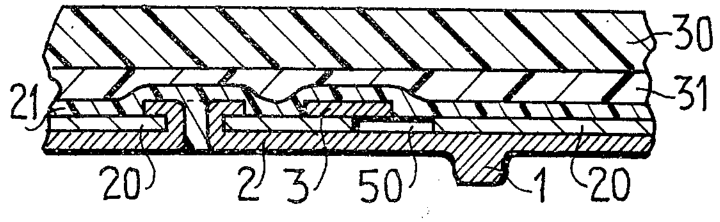
Figure 11:
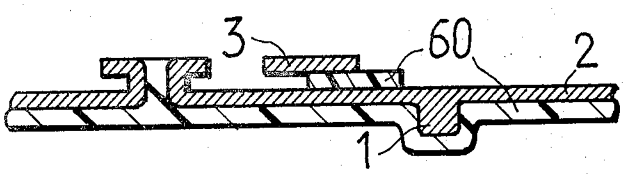
Figure 12:
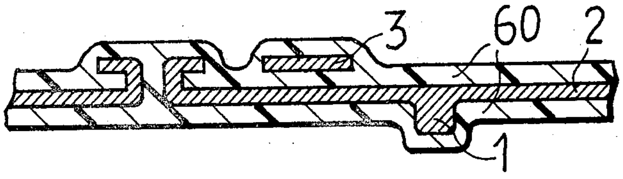

In the operation of converting the device from the stage shown in FIG. 9 to that shown in FIG. 10, the function of the negative photosensitive resin is to protect the surface opposite to the envelope in order not to compromise the etching away of the copper during the eighth step illustrated in FIGS. 11 and 12. The copper which remains is entirely dissolved by etching using iron perchloride for example (FIG. 11). Subsequently, the second face is enveloped in the polyimide resin 60 (FIG. 12).

Figure 13:
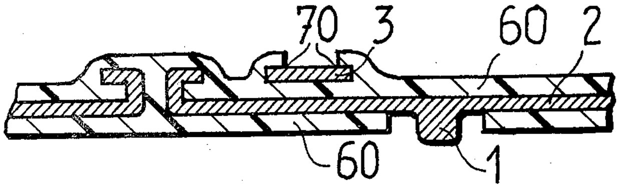

During the ninth step, schematically illustrated in FIG. 13, the circuit is covered with photosensitive resin (not shown in the figure) which is subsequently selectively removed at the location of the stud 1, on the one hand, over a width greater than that of said stud, and at the zone 70 on the other, this zone being designed to receive the stud of the double-sided circuit adjacent to it, at the time that the circuits are stacked together.

The polyimide resin 60 bared at these locations, is attached by a chemical agent such as cautic soda for example, thus, in accordance with the invention, uncovering the zones where the electrical connections are to be located. Then, if required, the remaining photosensitive resin can be removed.

Instead of removing the polyimide resin in order to expose the stud contact zones, the same results can be achieved by selectively depositing an epoxy resin, for example, by silk screen printing methods. In this case, the resin is applied to the circuit by means of a silk screen whose meshes are blocked at the locations at which resin deposition is not required.

The double-sided circuits thus produced and equipped with their active or passive elements, can then be stacked. Each stud is placed in contact with the corresponding conductor of the adjacent circuit, held in place by means of a mechanical clamping system.

Figure 14:
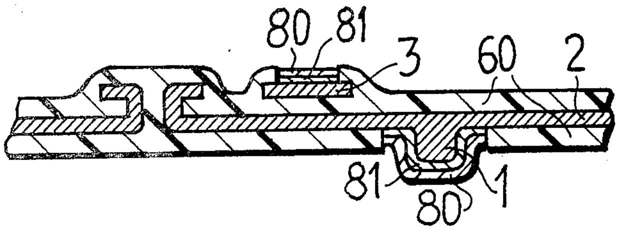
FIG. 14 illustrates a variant embodiment.

A variant embodiment shown in FIG. 14, makes it possible to dispense with this mechanical system. A film 80 of a low melting point material is deposited upon the zones which are to be placed in contact with the adjacent circuits. It may for example be an alloy of tin and lead.

A barrier 81 which prevents the diffusion of this alloy into the underlying conductor, is previously deposited upon said zones.

The double-sided circuits are then stacked and placed in an oven whose temperature is very slightly in excess of the melting temperature of the film 80 (250° for example if it is an alloy of tin and lead in proportions of 60% Sn and 40% Pb).

After cooling, all the double-sided circuits thus assembled together, are integrally attached together. To replace a circuit which has become defective, it is merely necessary to raise the system to the same temperature and to separate the circuits.

What I claim is:

1. A method of manufacturing a double-sided circuit comprising at least one stud and at least one contact surface such that after stacking of said circuit with one another circuit of the same type, a stud of said circuit is in contact with a surface of said another circuit, said method comprising the following steps:

1. upon a temporary substrate etchable by predetermined chemical agent, having two opposite faces, forming through a first appropriate mask of photosensitive resin deposited upon said two faces, first, second and third zones where said resin is eliminated to bare said substrate, said first and second zones being opposite upon each of said two faces;
2. etching said substrate through said first and second zones to form a hole through said substrate;
3. depositing by electrolysis a first layer of a metal resistant to said agent upon said third zone corresponding to said stud;
4. baring said substrate through a second appropriate mask according to a predetermined pattern;
5. depositing by electrolysis said resisting metal everywhere said substrate is bared in order to form at least a first and a second conductor, said first conductor laying upon said first layer and upon the wall of said hole;
6. depositing a first film of resin of positive type on the face of the device thus obtained, corresponding to said stud and a second film of said resin upon the opposed face, and depositing upon said second film a protective film of dry photosensitive resin of negative type covered with polyethylene terephthalate;
7. etching a first part of said temporary substrate through a window made in said first film to hollow out a recess beneath said second conductor over half the width of said second conductor, and replacing said first part and said first film with said dielectric material;
8. etching the other part of said temporary substrate
9. recovering said both faces thus obtained with said dielectric material;
10. engraving said material through a third appropriate mask to bare said stud and said contact surface.

2. A method as claimed in claim 1, wherein said substrate is made of a metal.

3. A method as claimed in claim 1, wherein said metal is copper.

4. A method as claimed in claim 1, wherein said resisting metal is gold.

5. A method as claimed in claim 1, wherein said material is a polyimide resin.

* * * * *